(12) United States Patent
Benna et al.

(10) Patent No.: US 11,205,718 B1
(45) Date of Patent: Dec. 21, 2021

(54) HIGH PERFORMANCE SUPER-BETA NPN (SBNPN)

(71) Applicant: TEXAS INSTRUMENTS INCORPORATED, Dallas, TX (US)

(72) Inventors: Bernhard Benna, Nandlstadt (DE); Berthold Staufer, Moosberg (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 59 days.

(21) Appl. No.: 16/695,718

(22) Filed: Nov. 26, 2019

Related U.S. Application Data

(60) Provisional application No. 62/771,484, filed on Nov. 26, 2018.

(51) Int. Cl.
*H01L 29/737* (2006.01)
*H01L 29/66* (2006.01)
*H01L 21/265* (2006.01)
*H01L 21/285* (2006.01)
*H01L 29/45* (2006.01)
*H01L 29/167* (2006.01)
*H01L 29/08* (2006.01)
(Continued)

(52) U.S. Cl.
CPC .... *H01L 29/7373* (2013.01); *H01L 21/26513* (2013.01); *H01L 21/26586* (2013.01); *H01L 21/28525* (2013.01); *H01L 29/0817* (2013.01); *H01L 29/0826* (2013.01); *H01L 29/1004* (2013.01); *H01L 29/165* (2013.01); *H01L 29/167* (2013.01); *H01L 29/45* (2013.01); *H01L 29/66242* (2013.01)

(58) Field of Classification Search
CPC .............. H01L 29/7373; H01L 29/167; H01L 21/26586; H01L 29/165; H01L 29/0826; H01L 29/66242; H01L 21/26513; H01L 29/0817; H01L 29/45; H01L 29/1004; H01L 21/28525
See application file for complete search history.

(56) References Cited

U.S. PATENT DOCUMENTS 5,416,736 A * 5/1995 Kosa ................. H01L 21/26586
365/174
5,432,104 A * 7/1995 Sato .................... H01L 29/0821
148/DIG. 10

(Continued)

*Primary Examiner* — Syed I Gheyas
(74) *Attorney, Agent, or Firm* — Andrew R. Ralston; Charles A. Brill; Frank D. Cimino

(57) ABSTRACT

An integrated circuit includes one or more bipolar transistors, each including a first dielectric layer located over a semiconductor layer having a first conductivity type, the dielectric layer including an opening. A second dielectric layer is located between the first dielectric layer and the semiconductor layer. The second dielectric layer defines a first recess between the first dielectric layer and the semiconductor substrate at a first side of the opening, and a second recess between the first dielectric layer and the semiconductor substrate at a second opposite side of the opening. A first doped region of the semiconductor layer is located under the opening, the first doped region having a different second conductivity type and a first width. A second doped region of the semiconductor layer is also under the opening, the second doped region having the second conductivity type and underlying the first recess and the second recess.

23 Claims, 9 Drawing Sheets

(51) Int. Cl.
*H01L 29/10* (2006.01)
*H01L 29/165* (2006.01)

(56) References Cited

U.S. PATENT DOCUMENTS

| | | | |
|---|---|---|---|
| 5,933,733 A * | 8/1999 | Ferla | H01L 29/66712 |
| | | | 438/268 |
| 8,450,179 B2 | 5/2013 | El-Kareh et al. | |
| 10,032,868 B2 | 7/2018 | Benna et al. | |
| 2012/0080720 A1* | 4/2012 | Grant | H01L 29/66545 |
| | | | 257/190 |
| 2014/0138745 A1* | 5/2014 | Shin | H01L 29/1095 |
| | | | 257/192 |

* cited by examiner

US 11,205,718 B1

HIGH PERFORMANCE SUPER-BETA NPN (SBNPN)

CROSS REFERENCE TO RELATED APPLICATIONS

This application claims the benefit of U.S. provisional application No. 62/771,484, filed Nov. 26, 2018, which is incorporated by reference herein in its entirety. The application is related to U.S. Pat. No. 10,032,868, which is incorporated by reference herein in its entirety. This application is related to U.S. patent application Ser. No. 11/670,729, filed on Feb. 2, 2007 and granted as U.S. Pat. No. 8,450,179B2, which is incorporated by reference herein in its entirety.

FIELD

This disclosure relates to the field of semiconductor devices, and more particularly, but not exclusively, to bipolar transistors, e.g. NPN transistors with high common-emitter current gain.

BACKGROUND

NPN transistors have two N-type regions abutting a P-type region. One of the N-type regions is the collector, the P-type region is the base, and the second one of the N-type regions is the emitter. Depending upon how the NPN transistor is voltage biased, the NPN transistor will have a different mode of operation. When the emitter-base junction is reverse-biased and the collector-base junction is reverse-biased, the NPN transistor operates in a cutoff mode. When the emitter-base junction is forward biased and the collector-base junction is reverse biased, the NPN transistor operates in an active mode, and when the emitter-base junction is forward biased and the collector-base junction is forward biased, the NPN transistor operates in the saturation mode. The active mode may be used when the transistor is to be used as an amplifier, and the cutoff mode and the saturation mode may be used when the transistor is to be used as a switch.

One parameter of an NPN transistor is the common-emitter current gain, which is often known as $\beta$ or $H_{FE}$. When in the active mode, the common-emitter current gain is the ratio of the collector current $I_C$ over the base current $I_B$. For an NPN transistor, the common-emitter current gain may be in the range of 50 to 200. For a super-beta NPN (SBNPN) transistor, the may be, for example, 1,000, 3,000, 5,000, 10,000 or more.

SUMMARY

The inventors disclose various methods and devices that may be beneficially applied to manufacturing electronic devices including a bipolar transistor with high common-emitter current gain. While such embodiments may be expected to provide various improvements, such as higher gain and/or improved transistor matching, no particular result is a requirement of the described invention(s) unless explicitly recited in a particular claim.

In one example, the disclosure provides an integrated circuit includes having one or more bipolar transistors. Each of the transistors includes a first dielectric layer located over a semiconductor layer having a first conductivity type, the dielectric layer including an opening. A second dielectric layer is located between the first dielectric layer and the semiconductor layer. The second dielectric layer defines a first recess between the first dielectric layer and the semiconductor substrate at a first side of the opening, and a second recess between the first dielectric layer and the semiconductor substrate at a second opposite side of the opening. A first doped region of the semiconductor layer is located under the opening, the first doped region having a different second conductivity type and a first width. A second doped region of the semiconductor layer is also under the opening, the second doped region having the second conductivity type and underlying the first recess and the second recess.

Another example provides a method of forming an integrated circuit. A dielectric layer is formed over a semiconductor layer that has a first conductivity type. An opening is formed in the dielectric layer, exposing a portion of the semiconductor layer and forming a recess between the semiconductor layer and the dielectric layer. A first doped region is formed by implanting a dopant having a second different conductivity type into the semiconductor layer through the opening with an angle less than about 10°. A second doped region is formed by implanting the dopant through the opening with an angle of at least 30° such that the dopant is implanted into the semiconductor layer under the recess.

Another example provides an integrated circuit that includes an NPN bipolar transistor. The transistor includes an N-type collector region over a semiconductor substrate, a P-type base region over the collector region and an N-type emitter region within the base region. A silicon nitride layer is located over the base region and includes an opening. A silicon dioxide layer is located between the silicon nitride layer and the base region, the silicon dioxide layer defining a first recess between the silicon nitride layer and the base region at a first side of the opening, and a second recess between the silicon nitride layer and the semiconductor substrate at a second opposite side of the opening. An N-type halo region under the opening intersects a surface of the substrate and extends laterally with respect to the surface past the first and second recesses.

BRIEF DESCRIPTION OF THE DRAWINGS

For a detailed description of various examples, reference will now be made to the accompanying drawings, in which features may not be drawn to scale.

DETAILED DESCRIPTION

When manufacturing SBNPN transistors, the common-emitter current gain can vary within a wafer, can vary from wafer-to-wafer, and can vary from lot-to-lot. Ideally, this variation would be reduced to a minimum such that SBNPN transistors with consistent and predictable common-emitter current gains could be produced. Examples of this disclosure include SBNPN transistors and methods of making SBNPN transistors that produce SBNPN transistors with more consistent and predictable common-emitter current gains. In one example, an existing silicon oxide layer is removed, and a new silicon oxide layer is deposited that provides better uniformity in the subsequent emitter ion implant step than at least some conventional SBNPN transistors. The better uniformity in the subsequent emitter ion implant step results in reduced variation of the common-emitter current gain variation within a wafer, from wafer-to-wafer, and from lot-to-lot. In some examples, a shallow angled implant, sometimes referred to as a "halo implant", is additionally performed. The halo implant may mitigate effects caused by inhomogeneity at corners of the emitter region caused by recesses formed when the new silicon oxide layer is removed. Such implementations may further provide reduced base current (thus higher common-emitter current gain), improved transistor matching, and/or improvement of noise performance.

Figure 1:
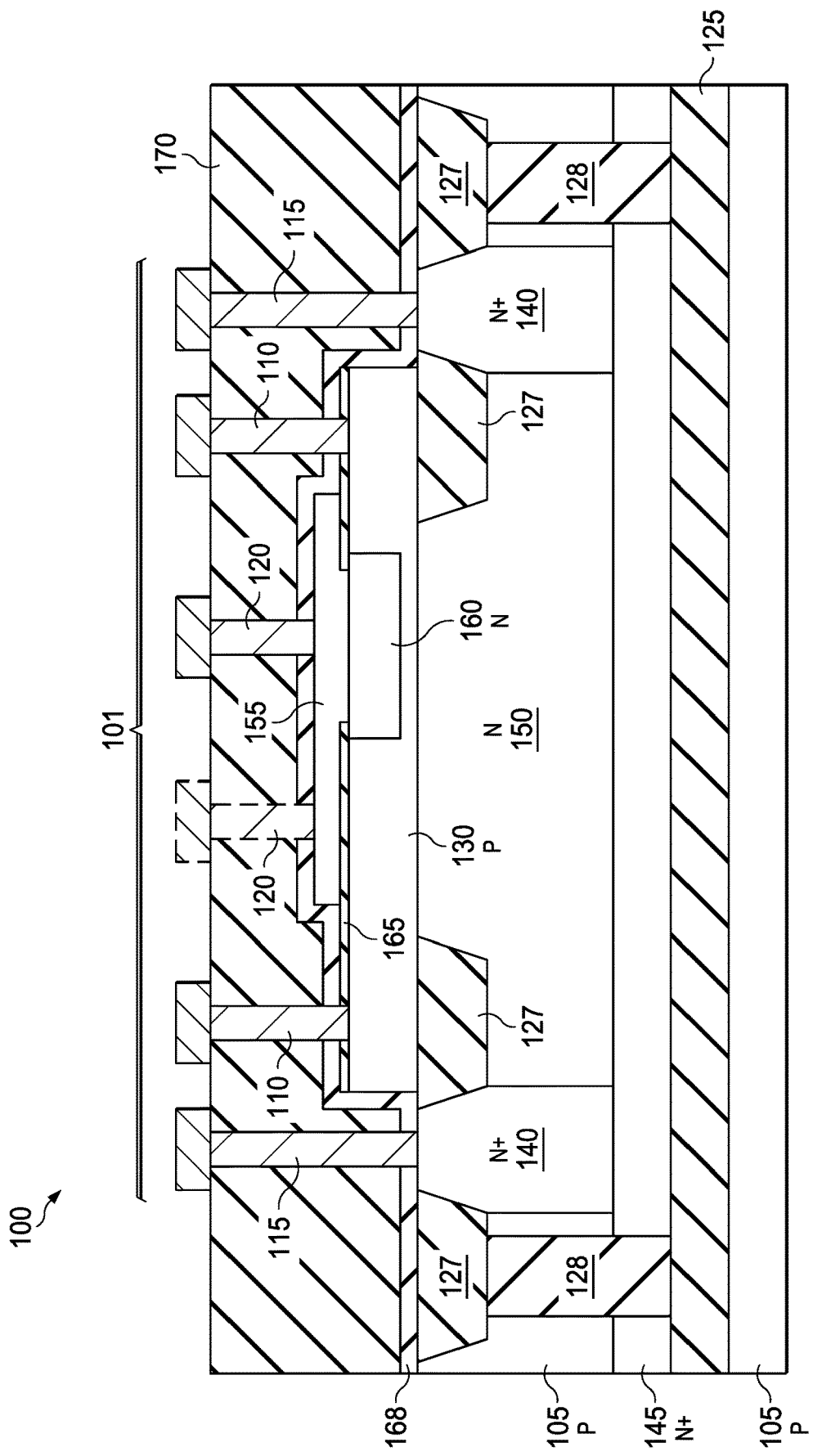
FIG. 1 shows a cross-sectional view of an SBNPN transistor in accordance with various examples.

FIG. 1 shows a cross-sectional view of one embodiment of an integrated circuit (IC) 100 including a transistor 101 in accordance with the disclosed embodiments. The transistor 101 may be described as an SBNPN transistor 101, but implementations are not limited to such transistors. The IC 100 is implemented on or on a semiconductor substrate 105, e.g. a p-type epitaxial layer of a silicon wafer, or die singulated from a silicon wafer. The integrated circuit may include other electronic components and/or transistors such as CMOS transistors, some of which may be interconnected to the transistor 101 to implement a circuit function. The transistor 101 has one or more base terminals (or base contacts) 110, one or more collector terminals (or collector contacts) 115, and one or more emitter terminals (or emitter contacts) 120, each of which may include a tungsten contact. The one or more base terminals 110, the one or more collector terminals 115, and the one or more emitter terminals 120 may be used as connections for electrical signals to a respective base, collector and emitter of the transistor 101. A metal silicide layer (not shown) may be located between each of the terminals 110, 115 and 120 and the underlying semiconductor to provide ohmic connections. A buried silicon oxide (BOX) layer 125 isolation trenches 127 (e.g. shallow trench isolation) and deep oxide trenches 128 are located within the substrate 105, and operate to electrically isolate the transistor 101 from other devices on the IC 100. The isolation trenches 127 may be silicon oxide filled deep trenches, and may include shallow trench isolation (STI) structures.

In some embodiments, the base portion of the transistor 101 includes the base terminal 110 and a base region 130. The base region 130 may be composed substantially of boron-doped SiGe, which may be formed by inclusion of Ge and B in an epitaxial growth process. The collector portion of the transistor 101 may comprise the collector terminal 115 and a plurality of N-type regions, including a vertical N-type channel 140, a horizontal N-type channel (N-buried layer, or NBL) 145, and an N-type epitaxial layer, or collector region, 150, each of which may be composed substantially of silicon. Thus, in the example of FIG. 1, the plurality of N-type regions forming part of the collector portion includes three N-type regions. The emitter portion of the transistor 101 includes the emitter terminal 120, a polysilicon structure 155, and an N-type emitter region 160. The polysilicon structure 155 may be referred to as a polysilicon electrode 155, and may be heavily doped. The polysilicon structure 155 reaches the emitter region 160 through an opening in a dielectric layer 165. The dielectric layer 165 may include two or more sublayers of different dielectric materials, as described further below. A dielectric layer 168, e.g. a phosphorous-doped oxide, covers the polysilicon structure 155, and an interlevel dielectric layer 170, sometimes referred to as a poly-metal dielectric (PMD) layer, covers the dielectric layer 168. The PMD layer 170 may be planarized as shown to facilitate subsequent formation of interconnect leveler. Unreferenced metal features connect to each of the terminals 110, 115 and 120 to electrically connect the transistor 101 to other components within the IC 100.

The emitter terminal 120 may be optionally located over the emitter region 160, as shown in solid outline, or offset from the emitter region 160, as shown in dashed outline. The latter configuration is referred to herein and in the claims as an "offset emitter terminal". The offset emitter terminal 120 is located over a full-thickness portion of the base region 130 such that emitter current flows horizontally through the polysilicon structure 155 between the offset emitter terminal 120 and the emitter region 160.

Figure 2:
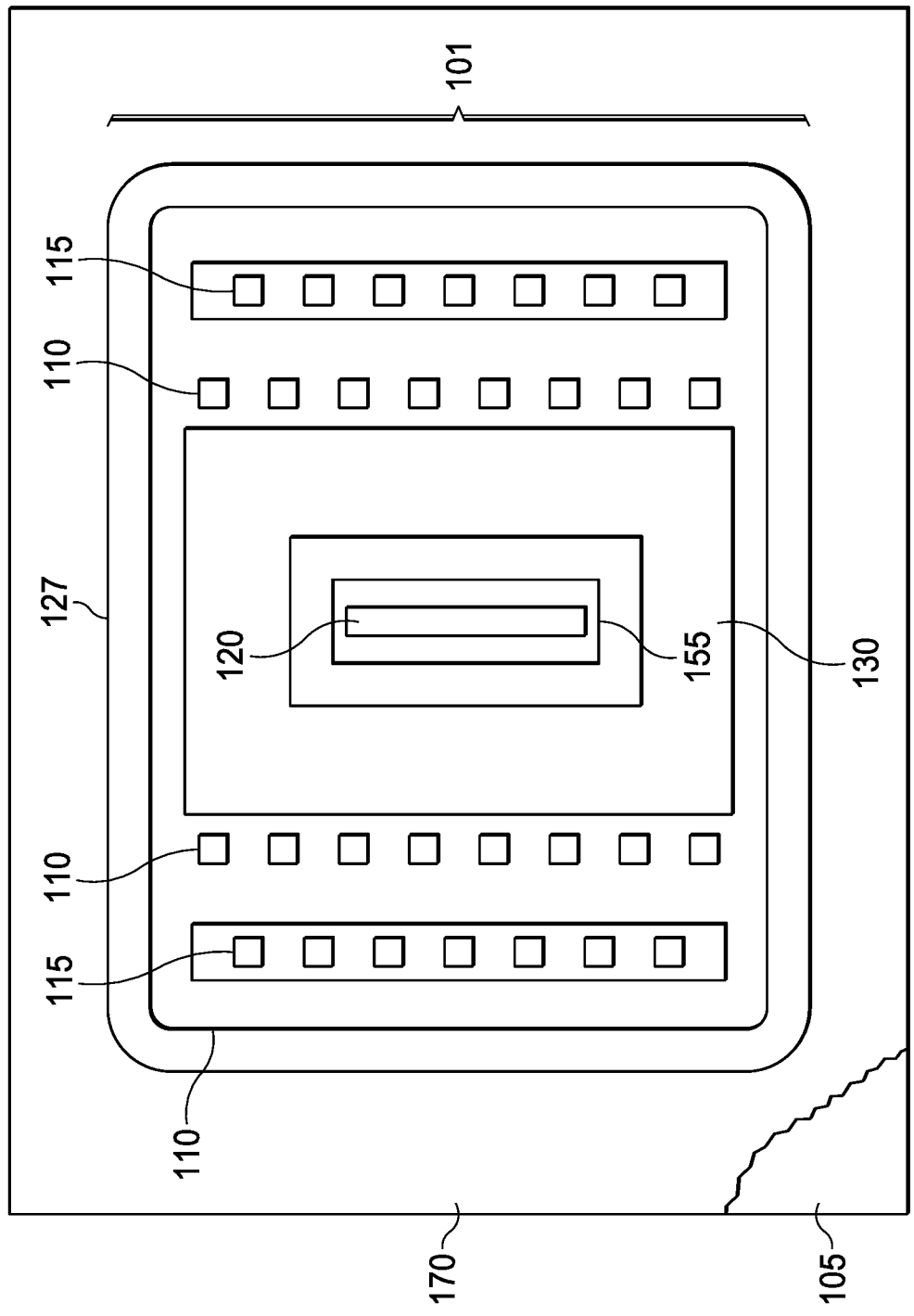
FIG. 2 shows a top-down view of an SBNPN transistor in accordance with various examples.

FIG. 2 shows a top-down view of the transistor 101 portion of the integrated circuit 100. In the example shown in FIG. 2, the transistor 101 has sixteen base terminals 110, seven collector terminals 115, and one elongated emitter terminal 120. Examples of the disclosure are not however limited to any particular number of terminals, shape of terminals, or size of terminals, and embodiments may have a different number of terminals, different shapes of terminals, and different sizes of terminals from what is shown in FIG. 2.

Figure 3:
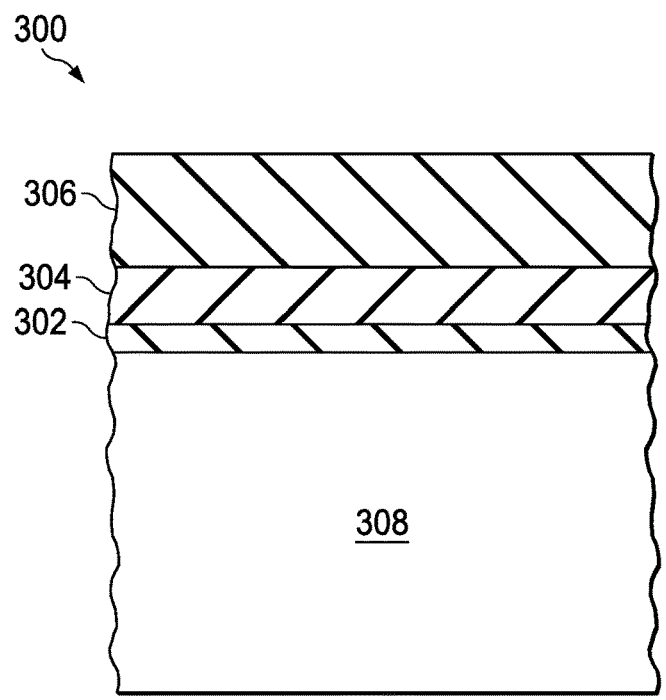
FIGS. 3-13 show cross-sectional views of an SBNPN transistor being manufactured in accordance with various examples.

FIGS. 3-13 show cross-sectional views of a transistor 300 at progressive stages of manufactured according to one example of the present disclosure. More specifically, FIGS. 3-13 show an embodiment of a method of manufacturing an emitter region (e.g., polysilicon structure 155 and N-type emitter region 160 in FIG. 1). In FIG. 3, a screen oxide layer 302, a TEOS (tetraethyl orthosilicate) silicon oxide layer 304 (sometimes referred to as TEOS-oxide for brevity), and a silicon nitride layer 306 are deposited on a P-type epitaxial layer, or base region 308. In one embodiment, the screen oxide layer 302 is about 2-5 nanometers (nm), the TEOS-oxide layer 304 is about 10-30 nm, and the silicon nitride layer is about 50-80 nm. However, other embodiments are not limited to any particular thicknesses, and the screen oxide layer 302, the TEOS-oxide layer 304, and the silicon nitride layer 306 can have different thicknesses.

Figure 4:
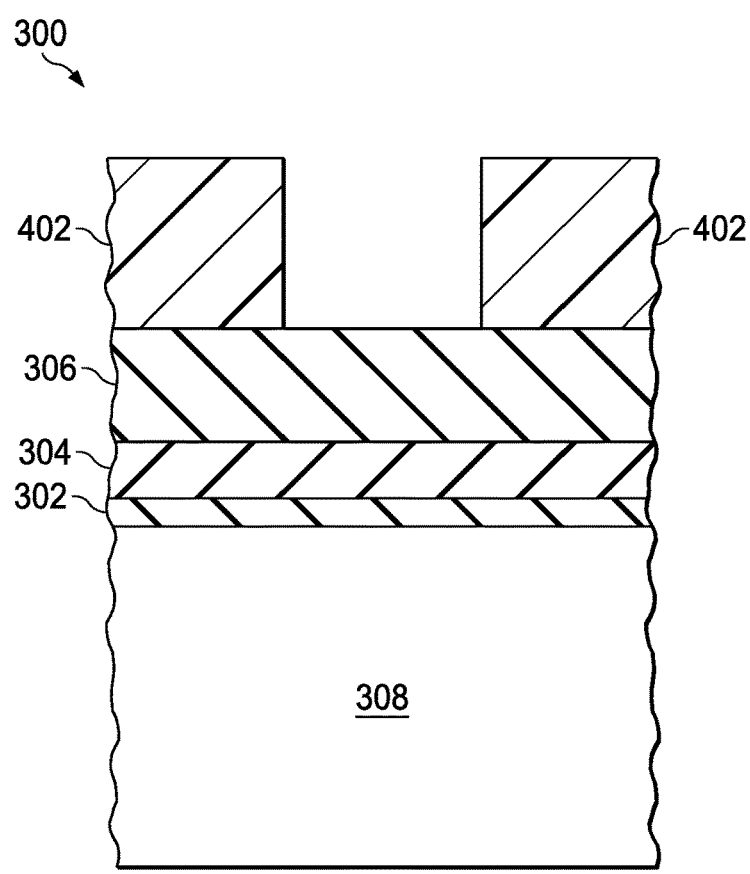

In FIG. 4, a layer of photoresist 402 is applied to the top of the silicon nitride layer 306, and the layer of photoresist 402 is patterned to form the area that will become the emitter of the SBNPN transistor. For example, the entire surface of the silicon nitride layer 306 is applied with photoresist. A photomask is then used to selectively shine light on areas of the photoresist, and a developer is used to remove the unwanted photoresist. The openings in the photoresist will be used to etch away material to form the emitter.

Figure 5:
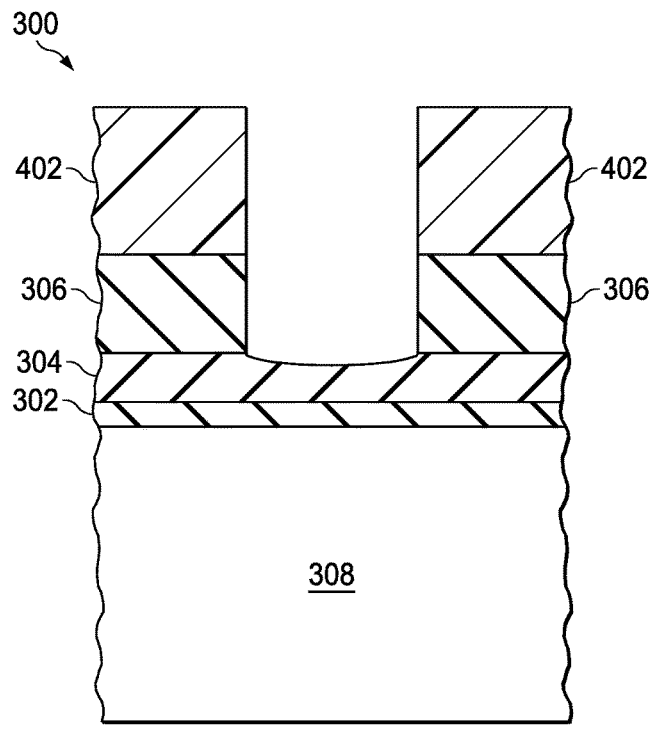

In FIG. 5, the silicon nitride layer 306 and a portion of the TEOS-oxide layer 304 that are not covered by the photoresist layer 402 are etched away. The TEOS-oxide layer 304 is etched away such that about 3-12 nm of the TEOS-oxide layer 304 remain.

Figure 6:
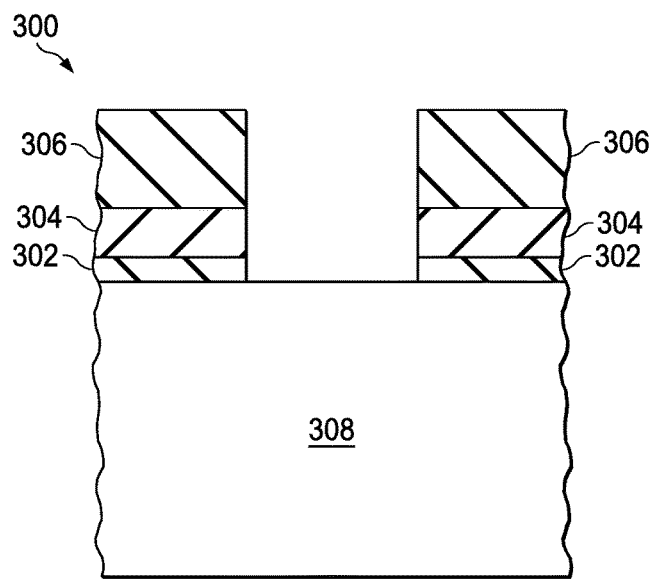

In FIG. 6, the photoresist layer 402 from FIGS. 4-5 is first removed. In one embodiment, the photoresist layer 402 is removed by first performing a plasma ashing step and then performing a wet etch (e.g., an $H_2SO_4$ and $H_2O_2$ wet etch) to remove any remaining photoresist. After the photoresist layer 402 is removed, another wet etch is performed to remove the exposed TEOS-oxide layer 304 and screen oxide layer 302 in the emitter region. For example, a hydrofluoric acid (HF) wet etch may be performed. Embodiments are not however limited to any particular type of etch to remove the exposed TEOS-oxide layer 304.

Figure 7:
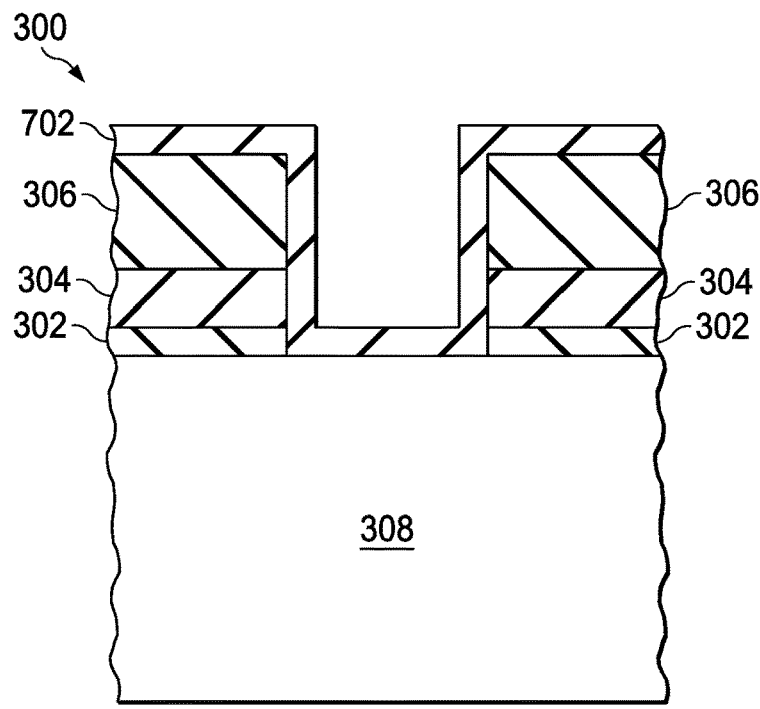

In the example of FIG. 7, a second TEOS-oxide layer 702 is deposited over the top of the silicon nitride layer 306, along the sides of the silicon nitride layer 306, TEOS-oxide layer 304, and screen oxide layer 302, and over the top of the exposed P-type base region 308. In an embodiment, the second TEOS-oxide layer 702 is about 2-8 nm and may be deposited using a low temperature (e.g., 640° C.), low deposition rate process. The second TEOS-oxide layer 702 illustratively performs two functions. First, the second TEOS-oxide layer 702 acts as a homogenous screen oxide for the subsequent emitter implant step. Second, the second TEOS-oxide layer 702 acts to refill any undercut of the silicon nitride layer 306, TEOS-oxide layer 304, and screen oxide layer 302 that occurs due to the previously discussed wet etch that removes the exposed TEOS-oxide layer 304.

Figure 8:
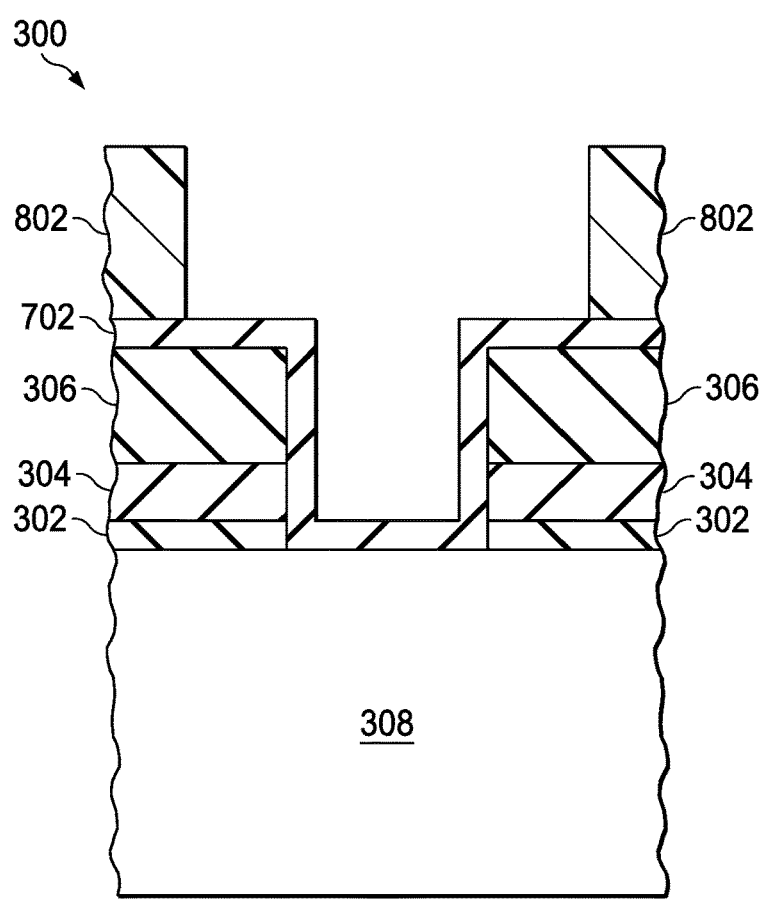

In FIG. 8, a second layer of photoresist 802 is applied to the top of the second TEOS-oxide layer 702. The layer of photoresist 802 is patterned to expose the portions of SBNPN transistor that will receive the emitter implant step and to protect the portions of the SBNPN transistor that will be blocked from receiving the emitter implant step.

Figure 9:
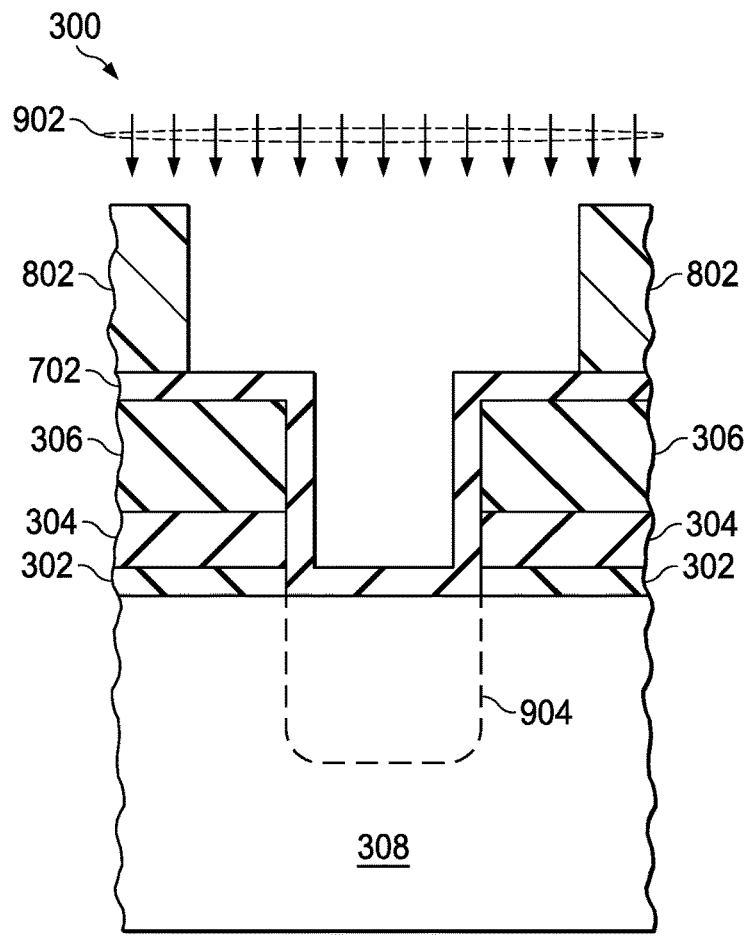

In FIG. 9, the emitter implant step is performed. N-type ions 902 (e.g., arsenic or phosphorous ions) are projected onto the SBNPN transistor. The exposed areas that include the areas where the second TEOS-oxide layer 702 covers the P-type base region 308 receive the implant. The second TEOS-oxide layer 702 acts as a screen oxide layer allowing the N-type ions 902 to pass through and penetrate the P-type base region 308. This forms an N-type region 904 that acts as the emitter and may be referred to as the emitter region 904. The emitter implant step may include a relatively small tilt angle, e.g. between 5° and 10°. This tilt angle may have the effect of causing the emitter region 904 to extend slightly below the screen oxide layer 302 at the periphery of the opening in the layers 302, 304, 306. In one non-limiting example the N-type ions 902 may implanted with an energy of 25 keV with a dose of 3.5E13 cm$^{-2}$ at an angle of 7°. All angles described herein and in the claims are relative to a reference direction normal to the base region 308, also referred to as the "surface normal".

Figure 10:
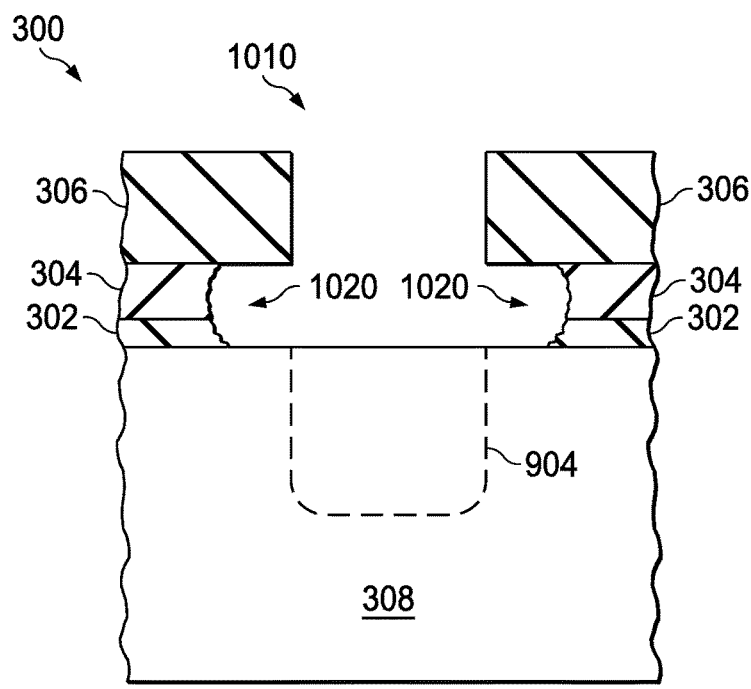

In FIG. 10, the layer of photoresist 802 from FIGS. 8-9 is removed. In one embodiment, the layer of photoresist 802 is removed by performing a plasma ashing step and then performing a wet etch (e.g., an $H_2SO_4$ and $H_2O_2$ wet etch) to remove any remaining photoresist. After the layer of photoresist 802 is removed, another HF wet etch may be performed to remove the exposed TEOS-oxide layer 702 in the emitter region. Embodiments are not limited to any particular type of etch to remove the exposed TEOS-oxide layer 304 and include any etch that removes the exposed TEOS-oxide layer 304.

In some implementations this oxide etch may remove a portion of the TEOS-oxide layer 304 and/or the screen oxide layer 302, producing an opening 1010 with an undercuts, or recesses, 1020. The recesses 1020 may be undesirable in some cases, because they may result in an emitter/base periphery that is not well-defined. More particularly, as described further below, in subsequent processing polysilicon may be formed within the opening 1010 and then heavily doped. The doped polysilicon may act as a dopant source to further dope the emitter region 904 of the transistor. In cases in which the recesses 1020 extend far enough laterally with respect to the base region 308 surface, the polysilicon doping may not reach the polysilicon at the ends of the recesses 1020. Base current is determined by contributions by intrinsic base current and peripheral base current. Thus, uncertainty, or random variation, of the periphery may result in poor matching of the common-emitter gain, $H_{FE}$, among transistors on a same device or transistors in a same manufacturing wafer or lot.

Figure 11:
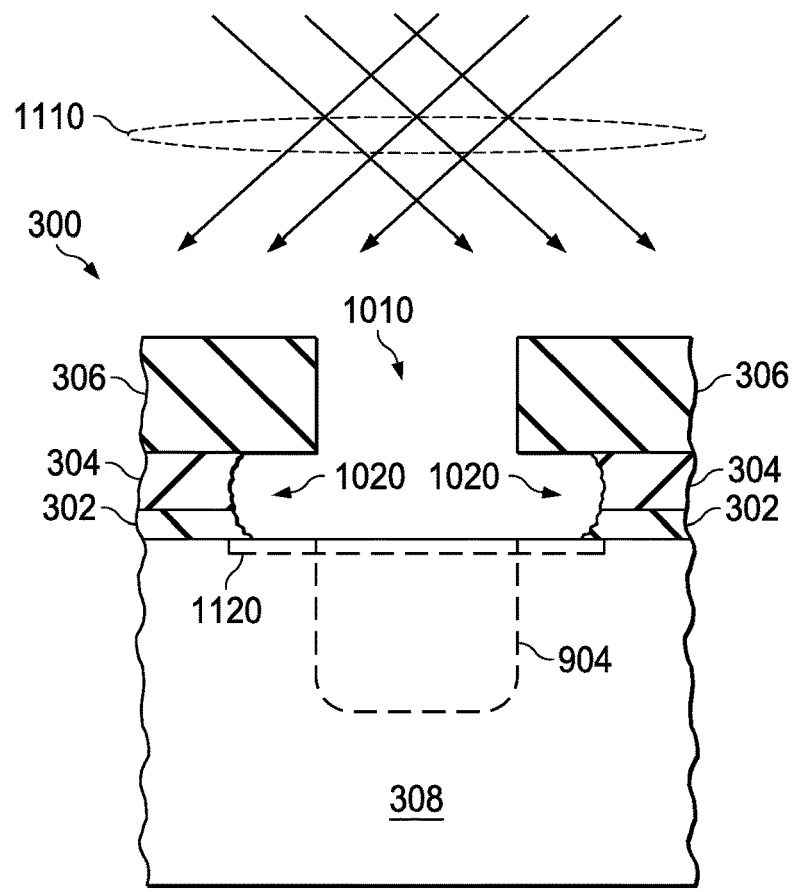

The aforementioned effects of periphery uncertainty may be substantially reduced by performing a second emitter implant, or halo implant, using a larger tilt angle, e.g. between 30° and 60°. FIG. 11 schematically illustrates the halo implant as implant 1110, which results in a relatively shallow N-type halo region 1120. The tilt angle of the implant 1110 results in a periphery of the halo region 1120 that is larger than the periphery of the recess 1020. In various examples the halo region 1120 extends laterally past the ends of the recesses 1020. In one non-limiting example the implant 1110 provides N-type ions, e.g. arsenic, with an energy of 37 keV with a dose of 3E13 cm$^{-2}$ at an angle of 45°. Optionally rotation may be used to improve implant uniformity. The halo region 1120 may have a first thickness (depth below the base region 308 surface) 50% or less than a second thickness of the emitter region 904. In some cases the first thickness may be 20% or 10% of the second thickness.

Figure 12:
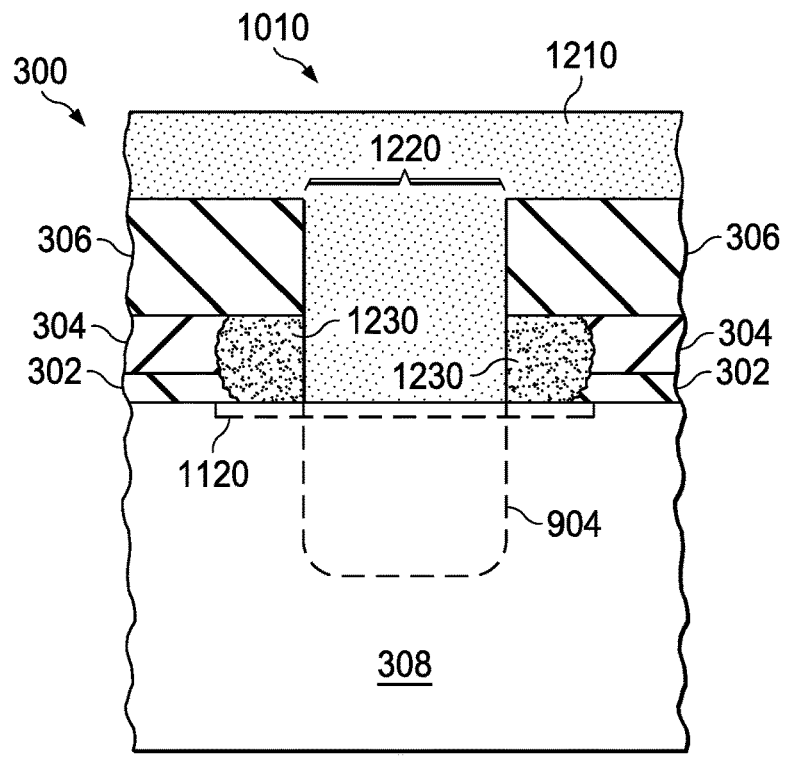

FIG. 12 shows the transistor 300 after forming a polysilicon structure 1210 within the opening 1010 and the recesses 1020. The polysilicon structure 1210 is heavily doped, e.g. by implantation, with an N-type dopant such as arsenic. A central portion 1220 of the polysilicon structure 1210 within the opening 1010 is heavily doped, while recessed portions 1230 may have a lower dopant concentration than the central portion 1220 due to shielding by the silicon nitride layer 306. The concentration of N-type dopant in the recessed portions 1230 may be 50% or less than the concentration of N-type dopant in the central portion 1220, and may be as much as 90% less at the ends of the recessed portions 1230. The N-type dopant in the polysilicon structure 1210 is diffused into the emitter region in a later process step, but the recessed portions 1230 may not provide sufficient N-type dopant to the base region 308 to convert the conductivity type from P-type to N-type. Thus in the absence of the halo region 1120 the recessed portions 1230 will contact the P-type silicon of the base region 308. This condition may contribute to the aforementioned poor matching and/or lower $H_{FE}$ than otherwise possible. However, the halo region 1120 ensures that the polysilicon structure 1210 contacts only P-type semiconductor along its interface with the underlying SiGe layer, mitigating such effects. As shown the halo region 1120 extends laterally past the ends of the recessed portions 1230 at the SiGe surface. While this aspect may be optional, it is expected that the benefit of the halo region 1120 is greatest when configured consistent with the illustrated example.

Figure 13:
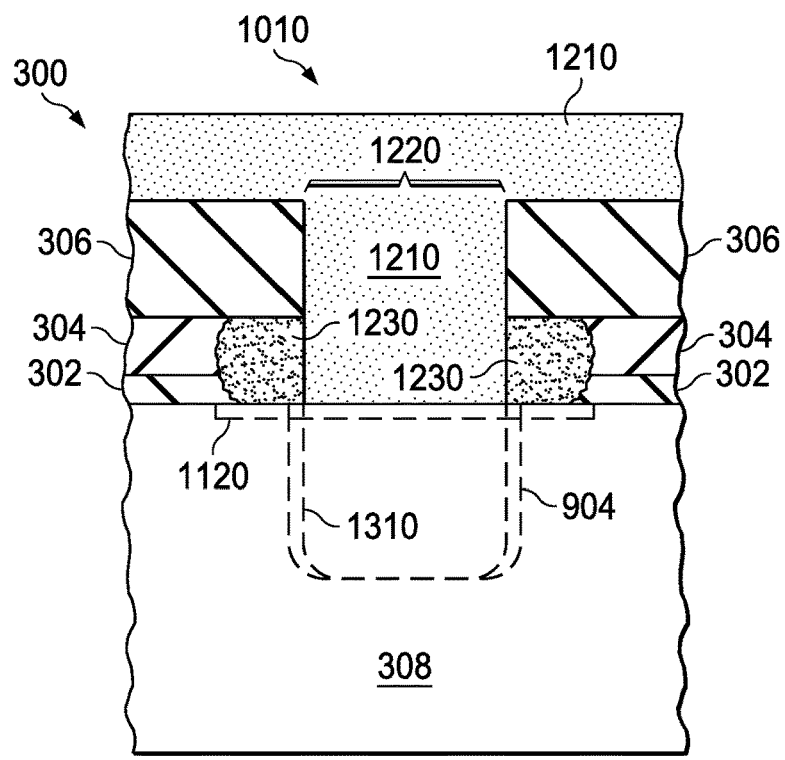

FIG. 13 shows the transistor 300 after a thermal drive process that activates out-diffusion of the N-type dopant from the polysilicon structure 1210 into the emitter region 904. A dopant-enriched region 1310 is located within the emitter region 904 under the polysilicon structure 1210. Thus, the emitter of the transistor 300 includes the emitter region 904, the enriched region 1310 and the halo region 1120, and the polysilicon structure 1210 contacts only N-type semiconductor material.

Figure 14:
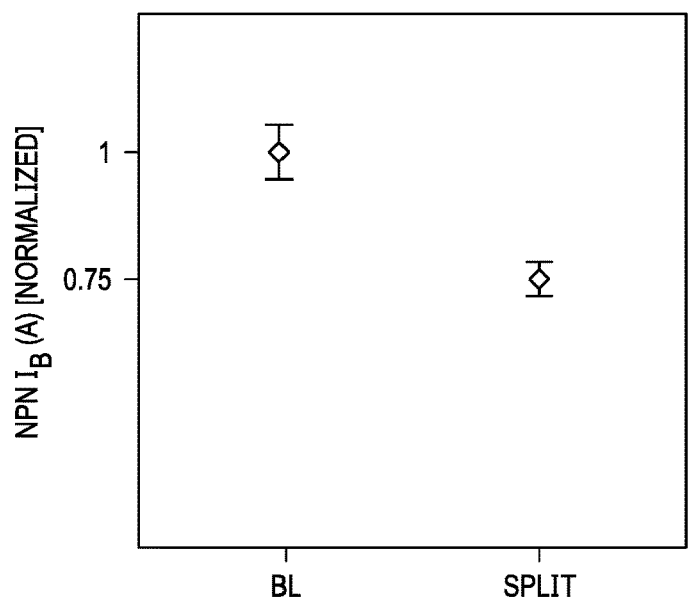
FIG. 14 presents a graphic showing base current reduction of an example implementation compared to a baseline implementation.

FIG. 14 presents a graphic showing reduction of $I_B$ and $\sigma(I_B)$ of a representative implementation, indicated as "Split" relative to a baseline implementation, indicated as "BL". Each data point represents a population of nominally identical transistors with a mean value of $I_B$ and error bars representative of the standard deviation. The baseline reference devices are nominally identical to the split devices, with the exception that only the split devices include the halo implant described herein As apparent from the graphic, the $I_B$ of the representative implementation is reduced by about 25% relative to the baseline, and the standard deviation of $I_B$ of the representative implementation is reduced by about a factor of three. These characteristics indicate that the common-emitter current gain of the transistor 300 can be expected be about 25% greater than the common-emitter current gain of a baseline transistor, e.g. lacking the halo implant. The data further indicate that the performance of transistors among a population of transistors, e.g. produced on a same wafer or in a same lot, is expected to be significantly better matched than for the baseline.

Figure 15:
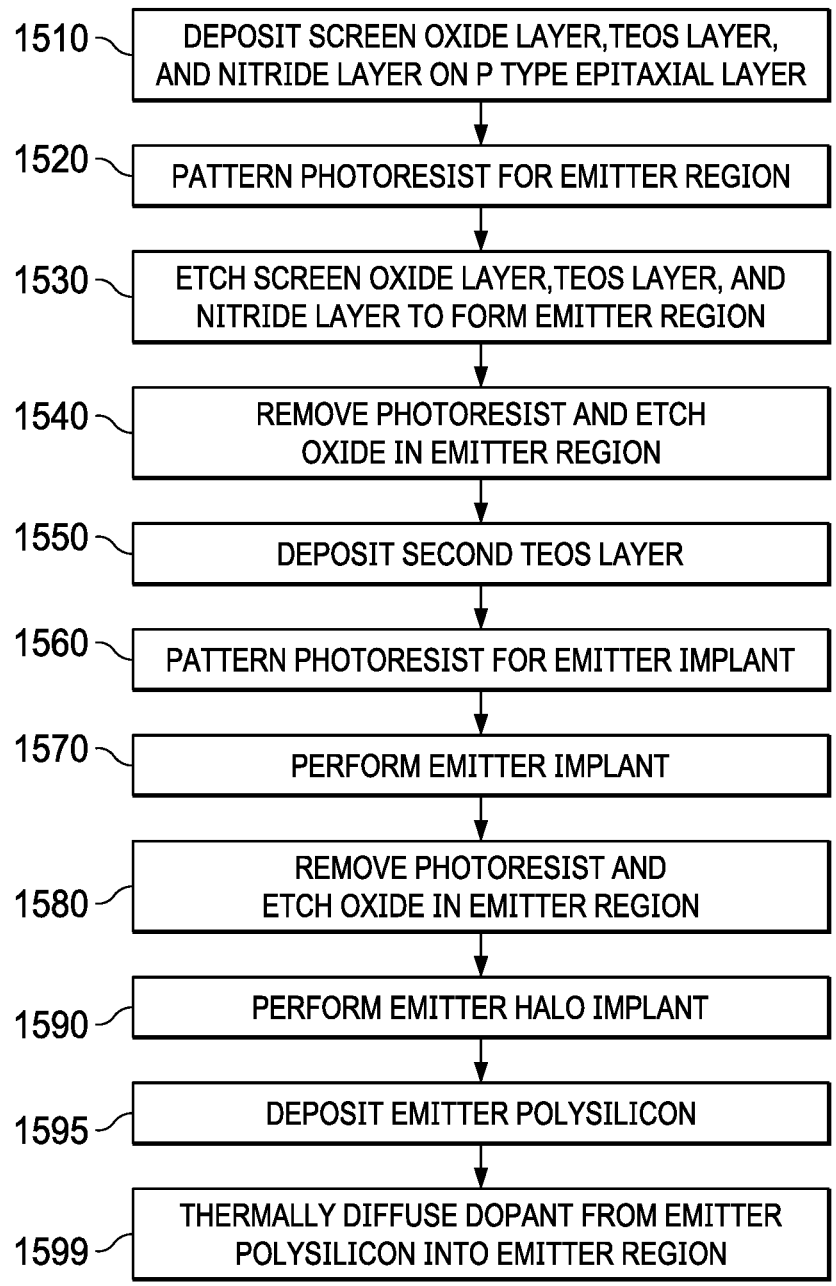
FIG. 15 shows a process flowchart of a method of manufacturing an emitter region of an SBNPN transistor in accordance with various examples.

FIG. 15 shows a process flowchart of a method of manufacturing an emitter region of an SBNPN transistor according to one embodiment of the present disclosure. At block 1510, a screen oxide layer, a TEOS-oxide layer, and a silicon nitride layer are deposited on a P-type epitaxial layer. At block 1520, a layer of photoresist is deposited on the silicon nitride layer and is patterned for the emitter region. At block 1530, the areas of the silicon nitride layer that are not covered by photoresist are etched away and a thin film of silicon oxide (e.g., 5 nm-10.5 nm) is left covering the P-type epitaxial layer. At block 1540, the layer of photoresist is removed and the thin film of silicon oxide is etched away. At block 1550, a second TEOS-oxide layer is deposited. The second TEOS-oxide layer acts as a homogenous screen oxide for the subsequent emitter implant step, and the second TEOS-oxide layer acts to refill any undercut of the silicon nitride layer, the first TEOS-oxide layer, and the screen oxide layer. At block 1560, a second layer of photoresist is deposited on the second TEOS-oxide layer and is patterned for the emitter implant. At block 1570, the emitter implant is performed with an N-type dopant to form the emitter N-type region. At block 1580, the second layer of photoresist is removed and the thin film of silicon oxide in the emitter region is etched away. At block 1590 a halo implant is performed, in which the N-type dopant is implanted with a tilt angle greater than 30°. At block 1595, the emitter polysilicon is deposited to form a polysilicon structure (e.g., polysilicon structure 120 in FIG. 1). At block 1599 dopant from the emitter polysilicon is thermally diffused into the emitter N-type region.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of forming an integrated circuit, comprising:
    forming a dielectric layer over a semiconductor layer having a first conductivity type;
    forming an opening in the dielectric layer, thereby exposing a portion of the semiconductor layer and forming a recess between the semiconductor layer and the dielectric layer;
    forming a first doped region by implanting a dopant having a second different conductivity type into the semiconductor layer through the opening with an angle less than about 10°; and
    forming a second doped region by implanting the dopant through the opening with an angle of at least 30° such that the dopant is implanted into the semiconductor layer under the recess.

2. The method as recited in claim 1, wherein the semiconductor layer comprises SiGe.

3. The method as recited in claim 1, wherein the dielectric layer comprises silicon nitride, and the recess is formed in a silicon oxide layer between the silicon nitride dielectric layer and the semiconductor layer.

4. The method as recited in claim 1, wherein the semiconductor layer is located over a semiconductor substrate having the second conductivity type.

5. The method as recited in claim 1, wherein the dopant comprises arsenic.

6. The method as recited in claim 1, further comprising forming doped polysilicon within the opening and the recess, wherein a concentration of the dopant in the recess is less than 50% a concentration of dopant within the opening.

7. The method as recited in claim 1, wherein forming the second doped region includes implanting the dopant with an angle between 30° and 60°.

8. The method as recited in claim 1, wherein forming the second doped region includes implanting the dopant with an angle of about 45°.

9. The method as recited in claim 1, wherein the first doped region has a first thickness and the second doped region has a second thickness no greater than 50% of the first thickness.

10. The method as recited in claim 4, further comprising configuring the first and second doped regions to operate as an emitter of a bipolar transistor, configuring the semiconductor layer to operate as a base of the bipolar transistor, and configuring the semiconductor substrate to operate as a collector of the bipolar transistor.

11. An integrated circuit, comprising:
    a first dielectric layer located over a semiconductor layer having a first conductivity type, the first dielectric layer including an opening;
    a second dielectric layer between the first dielectric layer and the semiconductor layer, the second dielectric layer defining a first recess between the first dielectric layer and the semiconductor substrate at a first side of the opening, and a second recess between the first dielectric layer and the semiconductor substrate at a second opposite side of the opening;
    a first doped region of the semiconductor layer under the opening, the first doped region having a different second conductivity type and a first width;
    a second doped region of the semiconductor layer under the opening, the second doped region having the second conductivity type and underlying the first recess and the second recess.

12. The IC as recited in claim 11, wherein the semiconductor layer is located on a semiconductor substrate having the second conductivity type.

13. The IC as recited in claim 12, wherein the semiconductor layer comprises SiGe and the semiconductor substrate is a silicon substrate.

14. The IC as recited in claim 11, wherein first and second doped regions comprise arsenic.

15. The IC as recited in claim 11, further comprising a doped polysilicon structure within the opening and extending into the first and second recesses, wherein the polysilicon structure has first dopant concentration within the opening and a second lower dopant concentration within the recesses.

16. The IC as recited in claim 11, wherein the semiconductor layer is configured to operate as a base of a bipolar transistor, the first and second doped regions are configured to operate as an emitter of the transistor, and the semiconductor substrate is configured to operate as a collector of the transistor.

17. The IC as recited in claim 16, wherein the transistor has a common-emitter current gain ($H_{FE}$) of at least 1000.

18. The IC as recited in claim 11, wherein the second doped region extends laterally past the first and second recesses.

19. The IC as recited in claim 11, wherein the first doped region extends into the semiconductor layer by a first distance and the second doped region extends into the semiconductor layer by a second distance that is no greater than about 50% of the first distance.

20. The IC as recited in claim 11, wherein the first conductivity type is P-type and the second conductivity type is N-type.

21. The IC as recited in claim 15, wherein the semiconductor layer is configured to operate as a base of a bipolar transistor, the first and second doped regions are configured to operate as an emitter of the transistor, and the semiconductor substrate is configured to operate as a collector of the transistor, and the polysilicon structure is contacted by an offset emitter terminal.

22. An integrated circuit having an NPN bipolar transistor, the transistor comprising:
  an N-type collector region over a semiconductor substrate;
  a P-type base region over the collector region;
  an N-type emitter region within the base region;
  a silicon nitride layer located over the base region and including an opening;
  a silicon dioxide layer between the silicon nitride layer and the base region, the silicon dioxide layer defining a first recess between the silicon nitride layer and the base region at a first side of the opening, and a second recess between the silicon nitride layer and the semiconductor substrate at a second opposite side of the opening; and
  an N-type halo region under the opening that intersects a surface of the substrate and extends laterally with respect to the surface past the first and second recesses.

23. The IC as recited in claim 22, further comprising:
  a polysilicon electrode located over the silicon nitride layer and extending through the opening to the emitter region; and
  an emitter contact that touches the polysilicon electrode over the silicon nitride layer.

* * * * *